United States Patent
An et al.

(10) Patent No.: US 11,864,339 B2
(45) Date of Patent: Jan. 2, 2024

(54) FRONT ACCESS LOCK MECHANISM FOR SERVER CHASSIS

(71) Applicant: ZT Group Int'l, Inc., Secaucus, NJ (US)

(72) Inventors: Chen An, Bergenfield, NJ (US); Zichun Song, Bergenfield, NJ (US)

(73) Assignee: ZT GROUP INT'L, INC., Secaucus, NJ (US)

( * ) Notice: Subject to any disclaimer, the term of this patent is extended or adjusted under 35 U.S.C. 154(b) by 89 days.

(21) Appl. No.: 17/401,834

(22) Filed: Aug. 13, 2021

(65) Prior Publication Data

US 2023/0054217 A1  Feb. 23, 2023

(51) Int. Cl.
*H05K 7/00* (2006.01)
*H05K 7/14* (2006.01)
*H05K 5/02* (2006.01)

(52) U.S. Cl.
CPC ......... *H05K 7/1489* (2013.01); *H05K 5/0221* (2013.01)

(58) Field of Classification Search
CPC ... E05C 1/00; E05C 1/004; E05C 1/08; E05C 1/085; E05C 1/10; Y10T 292/0997; Y10T 292/022; Y10T 292/1023; Y10T 292/1024; Y10T 292/1028; Y10T 292/696; Y10T 292/705; E05B 15/02; E05B 15/0205; E05B 15/021; E05B 15/022; E05B 15/024; E05B 2015/0275; E05B 63/24; E05B 63/244; H05K 7/1489; H05K 5/0221; H05K 7/1487; H05K 7/1488; H05K 7/1474; H05K 7/183; H05K 5/0204; H05K 5/0208;
(Continued)

(56) References Cited

U.S. PATENT DOCUMENTS 10,765,028 B1 * 9/2020 Beall ................. H05K 7/1489
11,337,332 B1 * 5/2022 An ..................... H05K 5/0221
(Continued)

FOREIGN PATENT DOCUMENTS

CN 208737366 * 4/2019
CN 109906005 * 9/2020
(Continued)

OTHER PUBLICATIONS

CN216352141 Fan et al; figure and abstract (Year: 2022).*

Primary Examiner — Janet M Wilkens
(74) Attorney, Agent, or Firm — POLSINELLI PC

(57) ABSTRACT

A lock device may include a slider assembly including a first slider, a second slider movably coupled to the first slider, and a base having a planar portion with a top rail and a bottom rail that hold the slider assembly and allows the relative movement of the first slider relative to the second slider along the top and bottom rails in the base. The second slider can move relative to the first slider to different positions including a latch lock position, a latch unlock position, and a latch impending lock position. The lock device may also include a latch assembly attached to a chassis. The latch assembly including a latch element is configured to move to a first, a second, and a third heights from the top rail of the base corresponding to the latch lock position, the latch unlock position, and the latch impending lock position of the slider assembly, respectively.

20 Claims, 16 Drawing Sheets

(58) Field of Classification Search
CPC .. H05K 5/0217; A47B 88/407; A47B 88/919; A47B 88/43; A47B 2088/4235; G06F 1/1679; G06F 1/186; G06F 1/187
USPC .............................. 312/332.1, 223.1, 223.2
See application file for complete search history.

(56) References Cited

U.S. PATENT DOCUMENTS

2006/0208499 A1* 9/2006 Rusiana ................ E05B 15/101
 292/170
2021/0360807 A1* 11/2021 Yu ......................... G06F 1/1679

FOREIGN PATENT DOCUMENTS

| CN | 212138061 | * | 12/2020 |
| CN | 216352141 | * | 4/2022 |
| TW | 1645810 | * | 12/2019 |

* cited by examiner

FRONT ACCESS LOCK MECHANISM FOR SERVER CHASSIS

FIELD

The disclosure is directed to a lock device for locking a server chassis in a housing.

BACKGROUND

A conventional latch featuring an auto lock mechanism for servers includes usually leaf spring latches that snap into a locking position, when a server chassis slides into a housing. The conventional latch featuring auto lock mechanism is disengaged with a constant external force to keep the lock unlatched, when the server chassis slides out of the housing.

BRIEF SUMMARY

In one aspect, a lock device may include a slider assembly including a first slider, a second slider movably coupled to the first slider, and a base having a planar portion with a top rail and a bottom rail that hold the slider assembly and allows the relative movement of the first slider relative to the second slider along the top and bottom rails in the base. The second slider can move relative to the first slider to different positions including a latch lock position, a latch unlock position, and a latch impending lock position. The lock device may also include a latch assembly attached to a chassis. The latch assembly including a latch element is configured to move to a first, a second, and a third heights from the top rail of the base corresponding to the latch lock position, the latch unlock position, and the latch impending lock position of the slider assembly, respectively.

In another aspect, a server chassis with a locking mechanism is provided. The server chassis may include a chassis configured to hold a server. The server chassis may also include a lock device installed on the chassis. The lock device may include a slider assembly including a first slider, a second slider movably coupled to the first slider, and a base having a planar portion with a top rail and a bottom rail that hold the slider assembly and allows the relative movement of the first slider relative to the second slider along the top and bottom rails in the base. The second slider can move relative to the first slider to different positions including a latch lock position, a latch unlock position, and a latch impending lock position. The lock device may also include a latch assembly attached to a chassis. The latch assembly including a latch element is configured to move to a first, a second, and a third heights from the top rail of the base corresponding to the latch lock position, the latch unlock position, and the latch impending lock position of the slider assembly, respectively.

Additional embodiments and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

A conventional latch in a chassis (e.g. server chassis) is normally in a locked status unless the latch is manually compressed. When using the conventional latch, a user would need to keep compressing the latch in order to slide the chassis out. Any lack of attention, during the process of sliding the chassis out, may lead the latch to jump back to an lock position, which may cause damage on cables coupled to the server chassis. Most latch mechanisms include a lock status and an unlock status.

The disclosure provides a lock device which adds one more status between the lock status and the unlock status, which is referred to a latch impending lock status. This latch impending lock status allows a latch element to remain in an unlock position when the chassis slides out of a housing. The latch impending lock status also allows the latch element to be triggered back to a lock position automatically once the chassis slides into the housing.

The disclosed lock device includes a slider assembly including two sliders with different heights for the latch element to sit on. The two sliders work as hard stoppers for the latch element to maintain in two different positions.

The lock device also includes a latch assembly, which includes a handle coupled to the latch element for user to compress the latch element to unlock the lock device. The latch assembly also includes two flanges, which allow the latch element to sit on one slider at a first time and sit on the other slider at a second time. The latch element and two sliders help achieve the auto lock function.

The disclosed lock device can be mounted and operated from a front side of the chassis. Once a user triggers the latch element to an unlock status, the latch element can maintain in an unlock position until the chassis is in a slide-in position. The disclosed lock device requires the user to use a single gesture to unlock the latch element, but without holding the latch element in the unlock position. Once the user unlocks the latch element of the lock device, the user can easily grab a chassis handle on a front panel of the chassis to slide the chassis out of a housing.

Figure 1A:
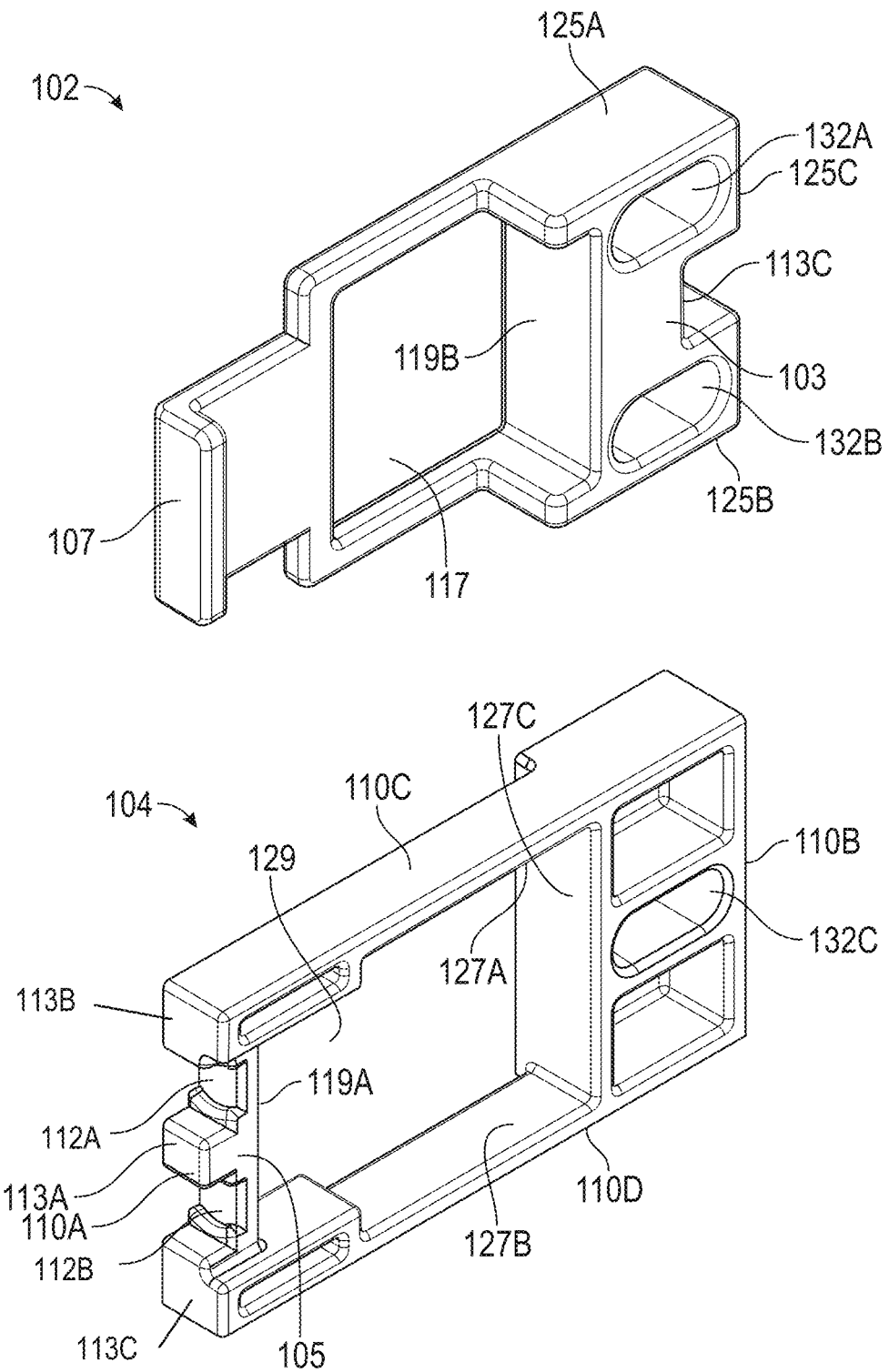
FIG. 1A illustrates a perspective view of two sliders in accordance with an embodiment of the disclosure.

FIG. 1A illustrates a perspective view of two sliders in accordance with an embodiment of the disclosure. As shown, a first slider 102 includes a substantially planar portion with a lip 107 at a front end of the planar portion. The first slider 102 also includes a back end planar portion 103 opposite to the front end, and a first slot 117 in a middle portion connected between the planar portion with the lip 107 at the front end and the back end planar portion 103. The first slot 117 is in a rectangular shape or square shape configured to engage with a latch element. The back end planar portion 103 includes an inner side surface 119B, a top surface 125A, a bottom surface 125B, and an outer side surface 125C having a recessed portion or recess 113C.

The first slider 102 also includes a first hole 132A near the top surface 125A and a second hole 132B near the bottom surface 125B. The recessed portion or recess 113C is between the first hole 132A and the second hole 132B. The first and second holes 132A-B are configured to allow the first slider to move horizontally relative to a base that holds the first slider and the second slider in an assembly. The back end planar portion 103 has a thickness larger than the planar portion with the lip 107 at the front end.

A second slider 104 includes a substantially planar plate in a substantially rectangular shape. The second slider 104 includes a front end 110A, which includes a protruded portion 113A in a middle, and two protruded portions 113B and 113C on each side of the protruded portion 113A. The front end 110A includes a first recess 112A between the protruded portions 113A and 113B, and a second recess 112B between the protruded portions 113A and 113C. The second slider 104 also includes a rear end 110B, which has a flat surface. The second slide 104 also includes a top side surface 110C and a bottom side surface 110D, which are flat surfaces.

The second slider 104 also includes a second slot 129 surrounded by surface 127A, surface 127B opposite to the surface 127A, surface 127C and surface 119A opposite to the surface 127CA near the front end 110A. The second slider 104 includes a third hole 132C configured to allow the second slider to move horizontally relative to the base.

Figure 1B:
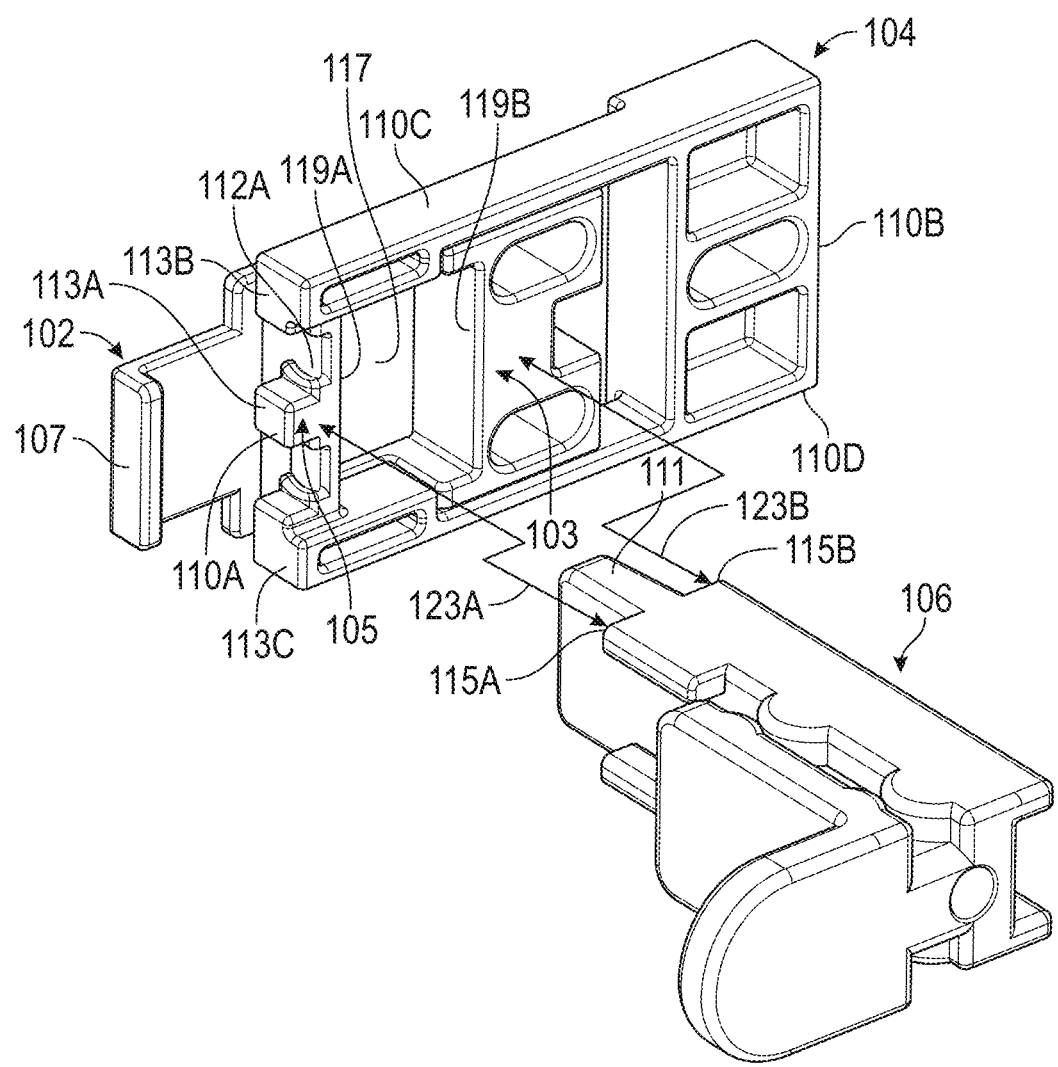
FIG. 1B illustrates a perspective view of a slider assembly including the two sliders of FIG. 1A and a perspective view of a latch assembly in accordance with an embodiment of the disclosure.

When the first slider 102 and the second slider 104 are assembled as illustrated in FIG. 1B below, the back end planar portion 103 of the first slider 102 fits into the second slot 129 of the second slider 104, such that the first slot 117 is between two opposite surfaces, e.g. the surface 119A of the second slide 104 and the surface 119B of the first slider 102. When the first slider moves relative to the second slider, the distance between the surface 125C of the first slider 102 and the surface 127C of the second slider 104 can change.

FIG. 1B illustrates a perspective view of a slider assembly including the two sliders of FIG. 1A and a perspective view of a latch assembly in accordance with an embodiment of the disclosure. As shown, a latch assembly 106 includes a latch element 111 configured to engage with the first slot 117. The latch assembly 106 also includes two flanges 115A and 115B on each side of the latch element 111. Each of the two flanges 115A-B of the latch assembly 106 is configured to sit against corresponding planar portion 105 of the second slider 104 and the planar portion 103 of the first slider 102, respectively, when the latch assembly 106 is inserted into the first slot 117, as pointed by arrows 123A and 123B.

Figure 2A:
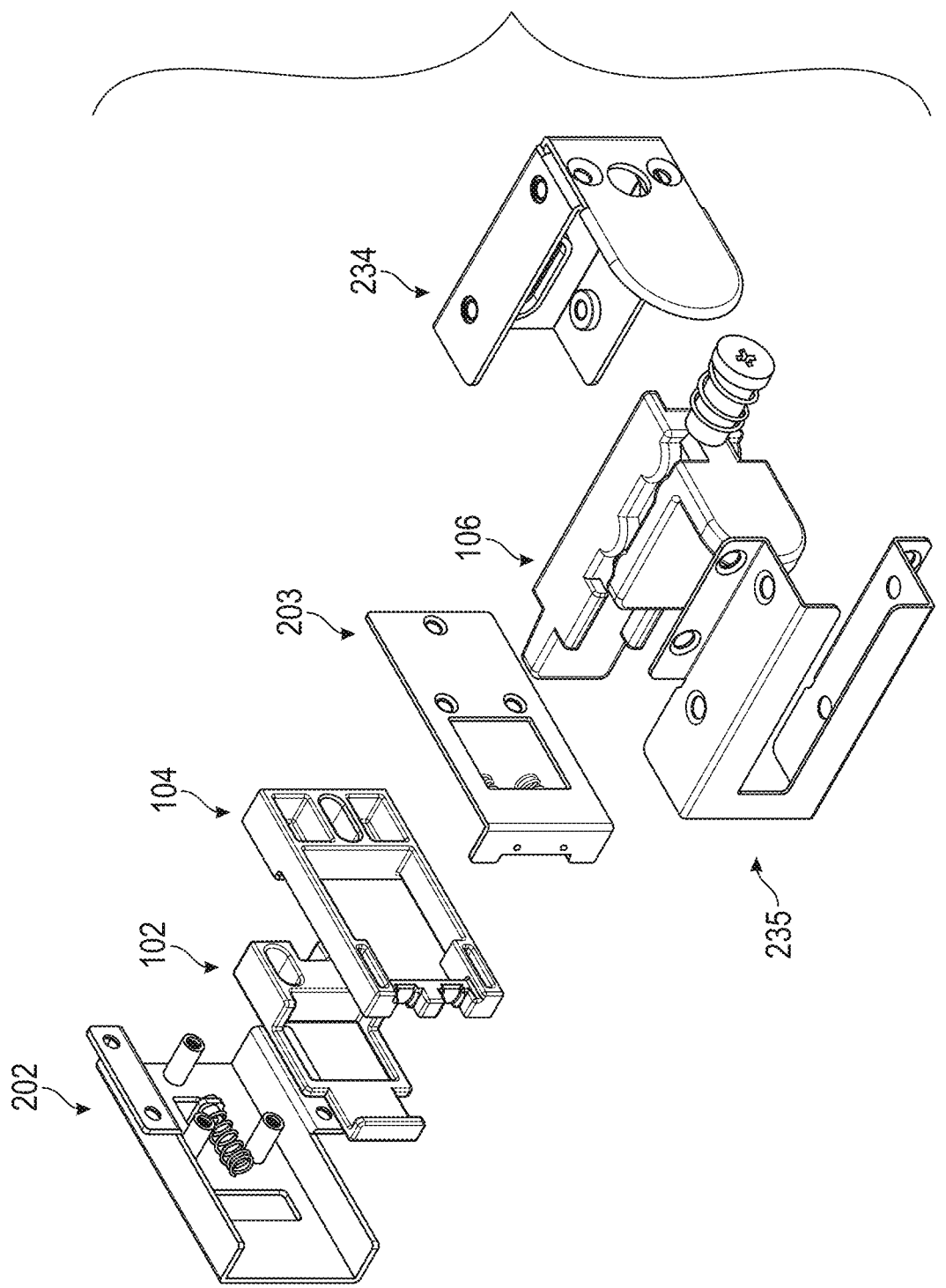
FIG. 2A is a perspective view illustrating configuration of components for a locking device prior to assembling in accordance with an embodiment of the disclosure.

FIG. 2A is a perspective view illustrating configuration of components for a locking device prior to assembling in accordance with an embodiment of the disclosure. As shown, the first and second sliders 102 and 104 are assembled with a first base 202 and a second base 203 together to form the slider assembly 212. The latch assembly 106 is assembled with a first base frame 235 and a second base frame 234.

Figure 2B:
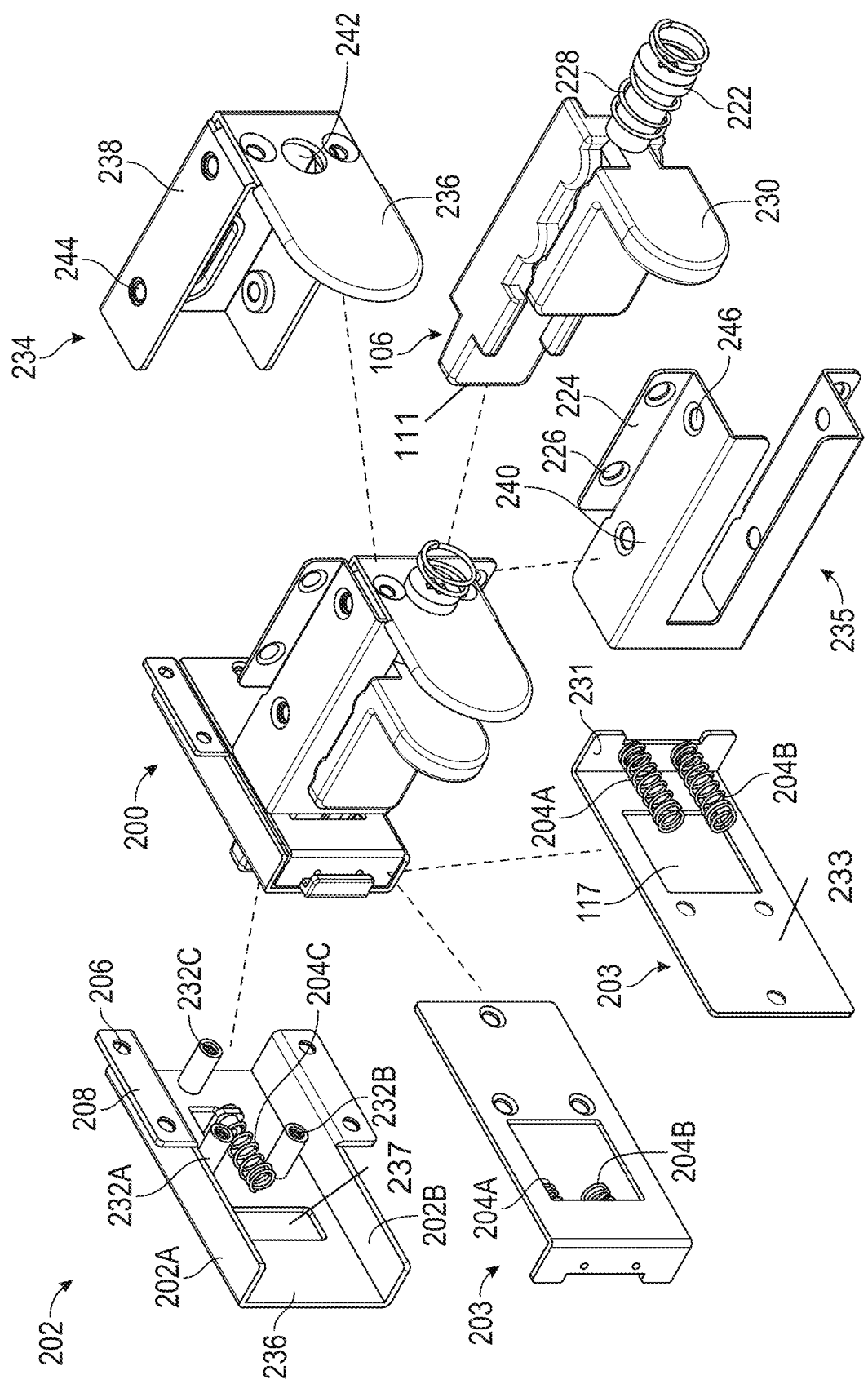
FIG. 2B is a perspective view of the components for the slider assembly including the sliders, a first base, and a second base prior to assembly and the components associated with the latch assembly prior to assembling in accordance with an embodiment of the disclosure.

FIG. 2B is a perspective view of the components for the slider assembly including the sliders, a first base, and a second base prior to assembling and the components associated with the latch assembly prior to assembling in accordance with an embodiment of the disclosure. A lock device 200 includes the first base 202 and second base 203 for assembling the first and second sliders and mounting to one surface of a chassis. The lock device 200 also includes the first base frame 235 and the second base frame 234 for supporting the latch assembly and mounting to another surface of the chassis.

As shown, the first base 202 includes a top surface 202A, a bottom surface 202B opposite to the top surface 202A, and a side surface 236 connected between edges of the top and bottom surfaces to form a U-shape. The first base 202 also includes three cylindrical posts 232A-C mounted on the side surface 236. The posts 232A-B are configured to allow the first slider 102 to move within the holes 132A-B horizontally. The post 232C is configured to allow the second slider 104 to move within the hole 132C horizontally. The first base 202 also includes a tab configured for spring 204C to mount. The spring 204C is oriented horizontally.

The first base 202 also includes a slot 237 that is configured to allow the latch element 111 to pass through. The first base 202 also includes a mounting surface 208 with holes configured to mount to a chassis.

The second base 203 includes a side surface 233 including the slot 117 and an end surface 231 connected to the side surface to form an L shape. The second base 203 includes tabs configured for springs 204A-B to mount. The end surface 231 is configured to fit to the front end of the second slider 104. The springs 204A-B can push the second slider 104 to the right.

The first base frame 235 includes a mounting plate 224 with holes 226 configured to attach to the chassis. The first base frame 235 also includes a top surface 240 perpendicularly connected to the mounting plate 224 to have an L-shape.

The second base frame 234 includes a top surface 238 with holes 244 configured to match with holes 246 on the top surface 240 of the first base frame. The second base frame 234 also includes a side surface 236 next to a handle 230 of the latch assembly 106. The side surface 236 is fixed to the chassis. When the latch assembly 106 is assembled with the first base frame 235 and the second base frame 234, the second base frame 234 slides into the first base frame with the latch assembly 106 sandwiched in between, such that the top surface 238 of the second base frame 234 is under the top surface 240 of the first base frame 235.

The latch assembly 106 includes the handle 230, which is configured to move relatively to the surface 236 of the second base frame 234. The handle 230 can be manually pressed toward the surface 236 of the second base frame 234 to unlock the latch assembly 106.

Figure 2C:
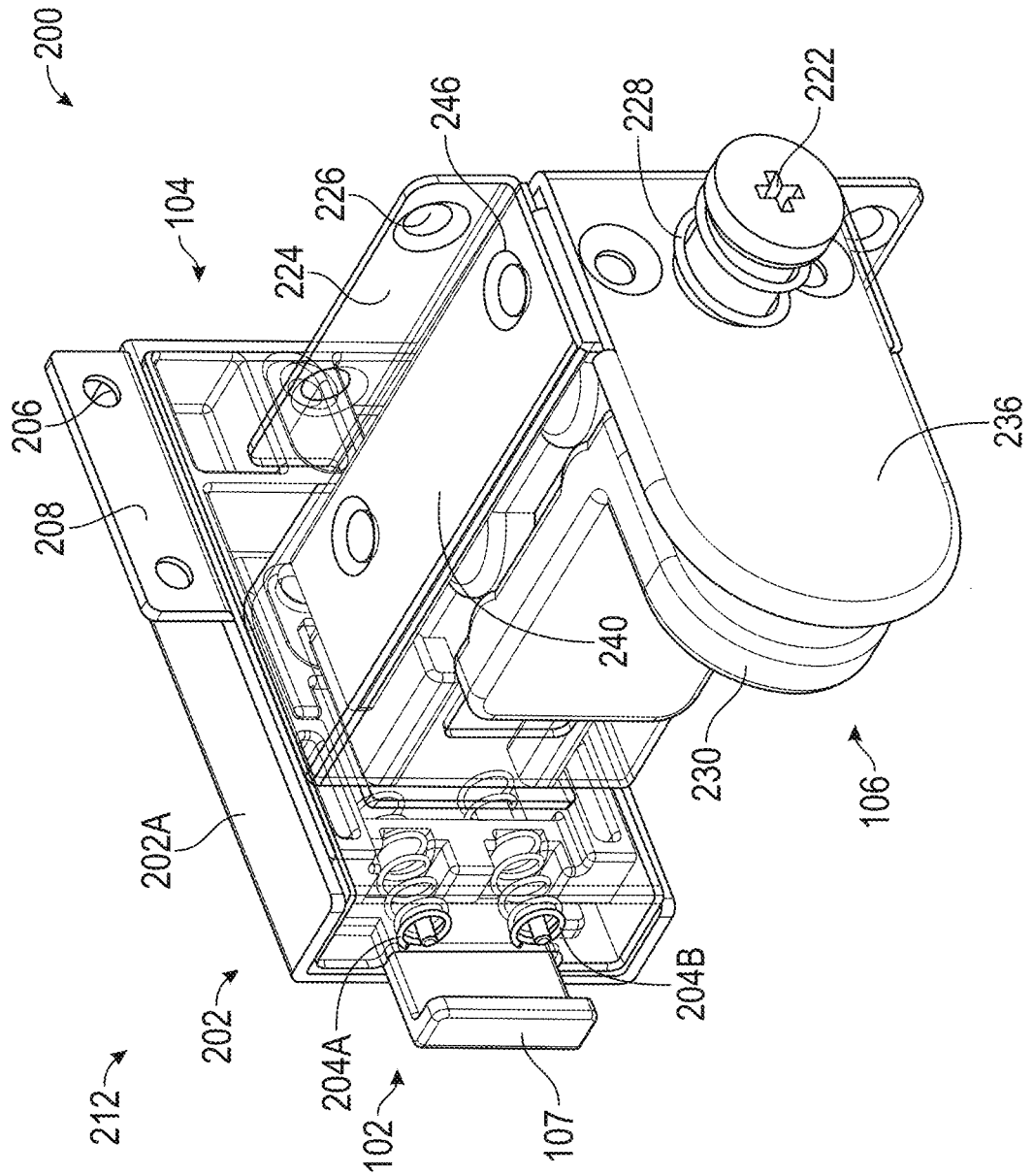
FIG. 2C is a perspective view of a lock device assembled from the components of FIG. 1A and FIGS. 2A-2B in accordance with an embodiment of the disclosure.

FIG. 2C is a perspective view of a lock device assembled from the components of FIG. 1A and FIGS. 2A-2B in accordance with an embodiment of the disclosure. In this perspective view, the second base frame 203 is removed to reveal the springs 204A-B. As shown, the lock device 200 includes the latch assembly 106 engaged with a slider assembly 212 that includes the first slider 102, the second slider 104, and the first slot 117 to engage with the latch element 111.

The slider assembly 212 also includes a base 202 includes a top rail 202A and a bottom rail 202B to hold the first slider 102 and the second slider 104. The lip 107 of the first slider extending beyond front surface 216 that ends at a front end 214A of the top rail 202A and a front end 214B of the bottom rail 202B.

The slider assembly 212 also includes a first spring 204A and a second spring 204B, which are configured to the second slider 104. The first and second springs 204A and 204B do not contact the first slider 102. The slider assembly 212 also includes a third spring 204C configured to engage with the first slider 102. The third recessed portion 113C of the first slider 102 is configured to hold the third spring 204C. The springs 204A-C may be compression springs.

In some variations, the first spring 204A and the second spring 204B generate a larger spring force than the third spring 204C.

The base 202 also includes a first mounting plate 208, which is arranged to attach to a side of a chassis (not shown). The first mounting plate 208 includes holes 206 for fasteners to attach to the side of the chassis, which may be a server chassis.

The latch assembly 106 is attached to a second mounting plate 224 which is attached to a front of the chassis through holes 226. The lock device 200 can be attached to the side and the front of the chassis, where the lip 107 of the first slider is on the front of the chassis. A user can push the lip 107 to make the latch assembly 106 return to a lock position if the user accidently unlocks the latch assembly 106 when the chassis is in a slide-in position. The chassis can slide out from a housing (not shown) and slide into the housing.

The latch assembly also includes a shoulder screw 222 that can guide the latch element 111 to travel. A fourth spring 228 positioned around the shoulder screw 222 always pushes the latch element 111 to a lock direction. The spring 228 can be a compression spring. The shoulder screw 222 along with the handle 230 and the spring 228 allow to move the latch element 111 to engage and disengage with the second slider assembly. The latch assembly 106 can be changed to an unlock position manually by using the handle 230.

Figure 3:
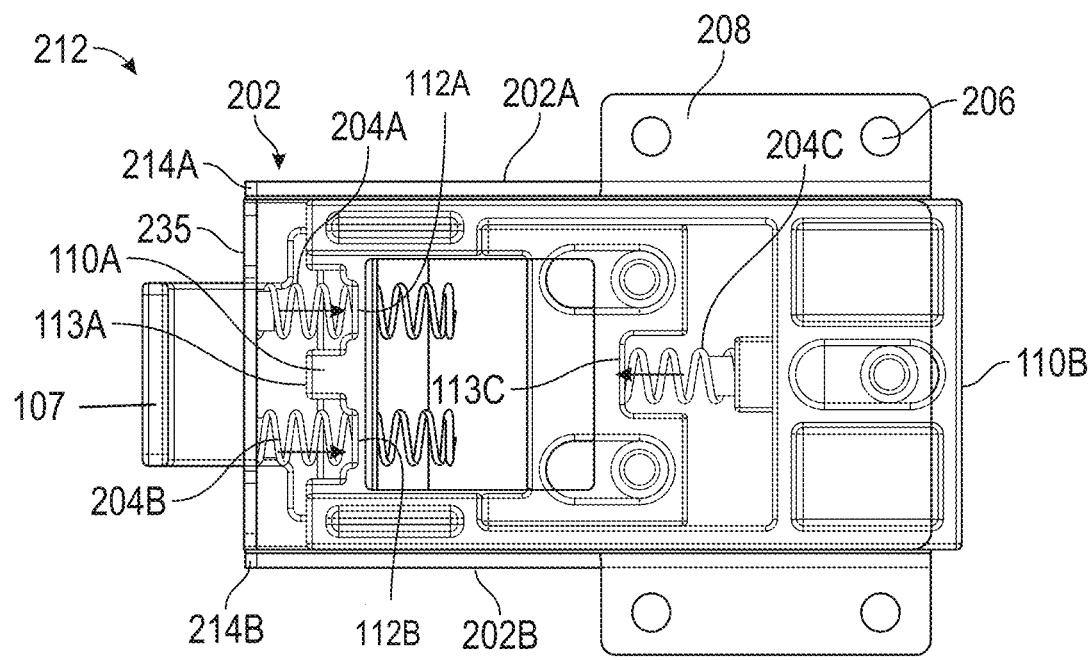
FIG. 3 illustrates a side view of the slider assembly in accordance with an embodiment of the disclosure.

FIG. 3 illustrates a side view of the slider assembly in accordance with an embodiment of the disclosure. The first recess 112A and the second recess 112B are at the front end 110A of the second slider 104. The front end 110A is closer to the lip 107 of the first slider 102 than the rear end 110B opposite to the front end 110A. Each of the first and second recesses 112A-B is configured to hold a portion of each of the first and second springs 204A-B.

The lock device 200 has an auto lock feature, which allows the latch assembly 106 to stay in three different positions, i.e. unlock, impending lock, and lock positions. As shown in FIG. 3, the first and second springs 204A and 204B can push the second slider 104 to the right, while the third spring 204C can push the first slider 102 to the left. The first and second springs 204A and 204B generate a larger force than the third spring 204C, such that the second slider 104 along with the first and second springs 204A-B are configured to push the first slider 102 to the right.

When the chassis is slided out of the housing, the latch assembly 106 can stay on the impending lock position in which the flange 115A sits on the second slider 104, and both the first and second sliders 102 and 104 are configured to be pushed to the right. If the first and second springs 204A and 204B generate less force than that of the third spring 204C, both the first and second sliders 102 and 104 cannot be pushed to the right.

In some variations, the second slider may have one recess near the front end 110A, where the recess is configured to engage with a spring. Rather than two springs engaged with the second slider 104, one spring may engage with the second slider 104. This spring generates a larger force than the spring engaged with the first slider 102, such that both the second slider and the first slider are pushed to the right when the chassis is in a slide-out position. When the chassis is in a slide-in position, the second slider is pushed to the left by a tab in a housing.

Figure 4:
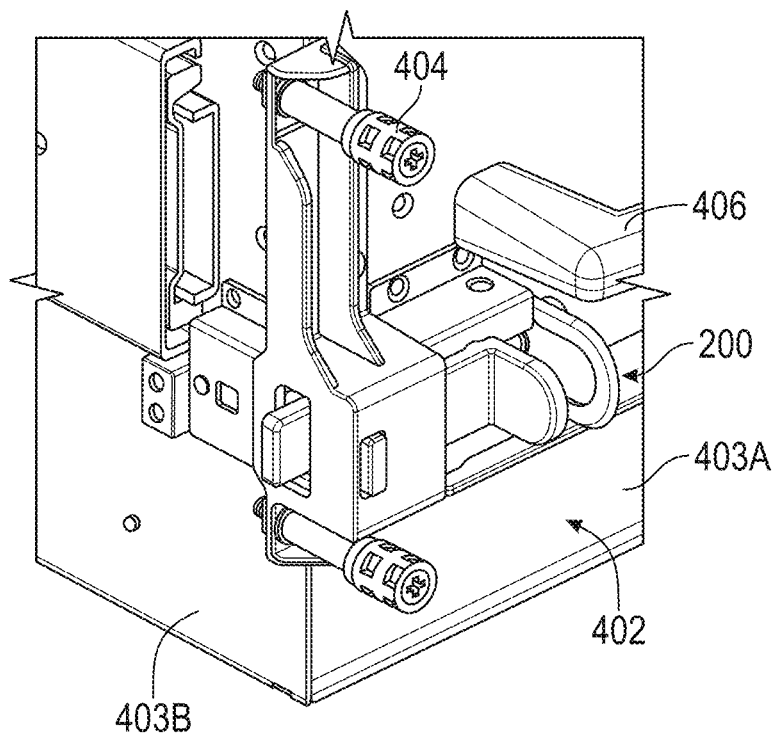
FIG. 4 illustrates a perspective view of the lock device of FIG. 2C mounted to a chassis in accordance with an embodiment of the disclosure.

FIG. 4 illustrates a perspective view of the lock device of FIG. 2C mounted to a chassis in accordance with an embodiment of the disclosure. As shown, the lock device 200 includes the latch assembly 106 assembled with the slider assembly 212. The lock device 200 is mounted to a chassis 402 having a front surface 403A and a side surface 403B, which is substantially perpendicular to the front surface 403A. A chassis handle 406 is located in on the front surface 403A. Once the latch element 111 is unlocked, a user can grab the chassis handle 406 to pull the chassis 402 out.

Figure 5A:
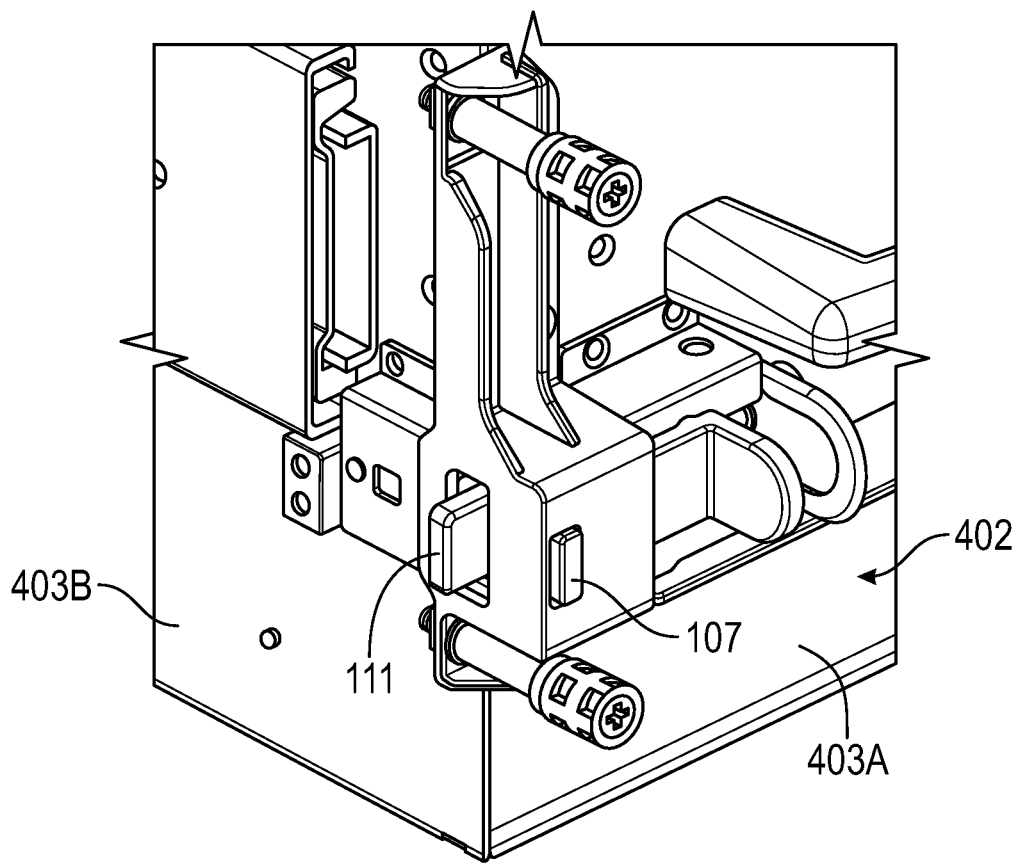
FIG. 5A illustrates a perspective view of the lock device of FIG. 2C in a latch lock status when the chassis slides into a housing in accordance with an embodiment of the disclosure.

FIG. 5A illustrates a perspective view of the lock device of FIG. 2C in a latch lock status when the chassis slides into a housing in accordance with an embodiment of the disclosure. As shown, the lip 107 of the first slider 102 is in a compressed position, while the latch element 111 extends out from the side surface 403B and is in a lock status.

Figure 5B:
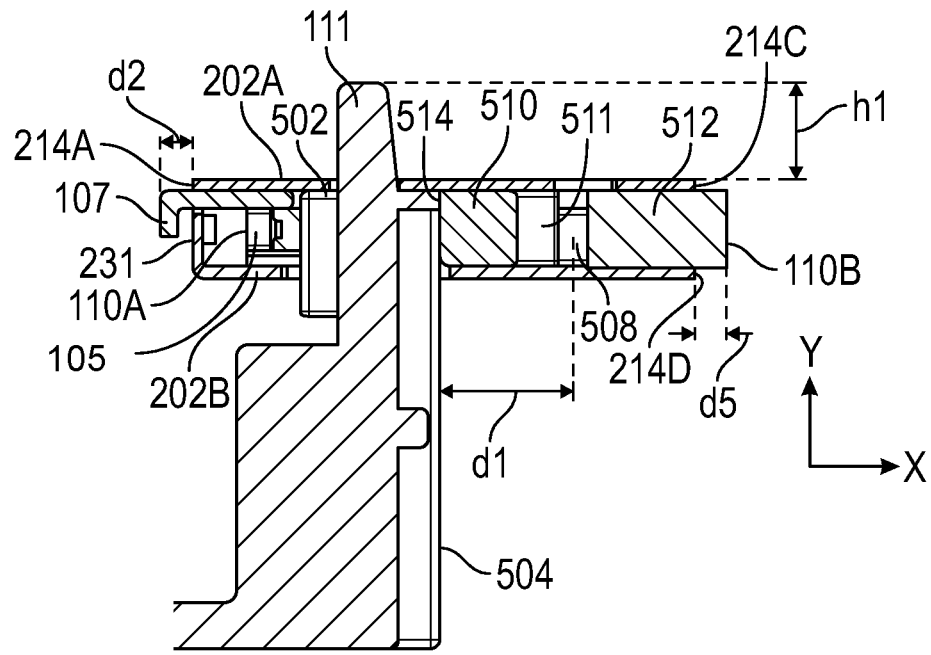
FIG. 5B illustrates a sectional view from the top of the lock device of FIG. 5A in a latch lock status in accordance with an embodiment of the disclosure.

FIG. 5B illustrates a sectional view from the top of the lock device of FIG. 5A in a latch lock status in accordance with an embodiment of the disclosure. This sectional view is from a top side of FIG. 6A with focus on auto lock feature, as illustrated by arrows A-A in FIG. 5A. As shown in FIG. 5B, the latch element 111 extends above the top rail 202A of the base at a height $h_1$, which is in a lock position. The first slider 102 includes the lip 107 on one side of the latch element 111 and a first portion 510 on an opposite side to the lip 107. The first portion 510 is against an end surface 514 of the flange 115B horizontally. The first portion 510 is part of the planar portion 103. The flanges 115A-B are against the top rail 202A, as illustrated by an interface 502. The first portion 510 is between the top rail 202A and the bottom rail 202B of the base 202 vertically. The first slider 102 also includes a second portion 511 next to the first portion 511.

The second slider 104 includes the planar portion 105, near the front end 110A, on one side of the latch element 111. The second slider 104 also includes a first portion 508 and a second portion 512, near the rear end 110B, on opposite side to the latch element 111. The first portion 508 has a horizontal distance $d_1$ from an outer surface 504 of the latch assembly 106.

A horizontal distance $d_2$ is between an outer surface of the lip 107 of the first slider and the end of the base 214A, as illustrated. An end surface 231 extends vertically from the end 214A of the base 202. This distance $d_2$ may change when the first slider 102 moves along the rails 202A and 202B of the base 202.

The rear end 110B of the second slider 104 has an outer surface, which is at a horizontal distance $d_5$ from ends 214C and 214D of the top rail 202A. This distance $d_5$ may change when the second slider 104 moves along the rails of the base 202. When the chassis slides into the housing, the rear end 110B of the second slider 104 is pushed by a tab in a housing (not shown).

Figure 6A:
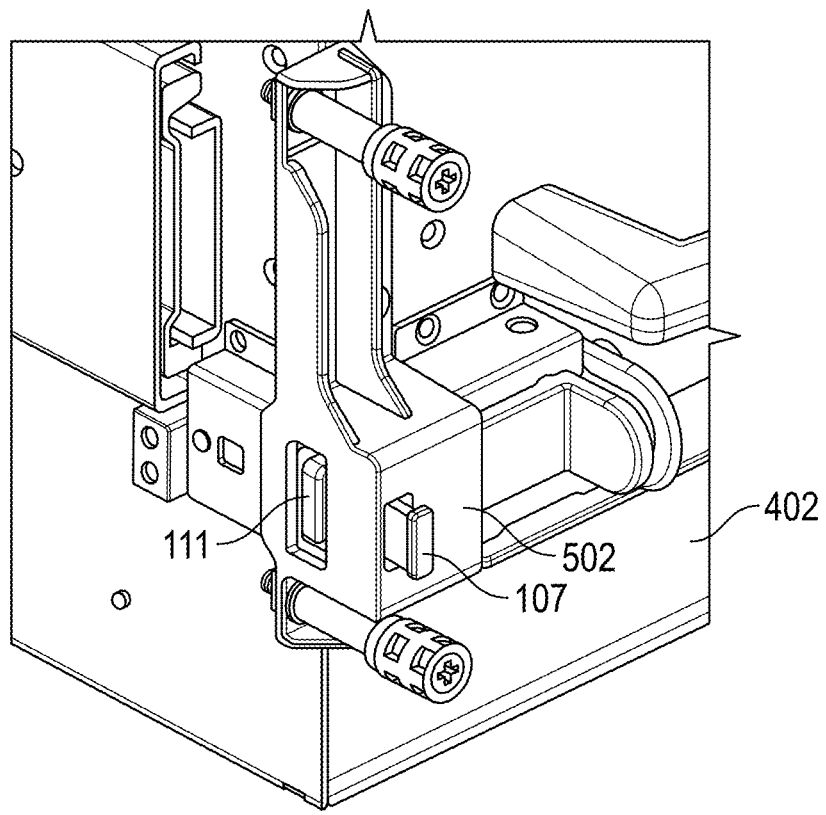
FIG. 6A illustrates a perspective view of the lock device of FIG. 2C in a latch unlock status when the chassis slides into a housing in accordance with an embodiment of the disclosure.

FIG. 6A illustrates a perspective view of the lock device of FIG. 2C in a latch unlock status when the chassis slides into a housing in accordance with an embodiment of the disclosure. As shown, the latch element 111 is in an unlock status while the lip of the first slider 102 extends out of the end surface 231.

Figure 6B:
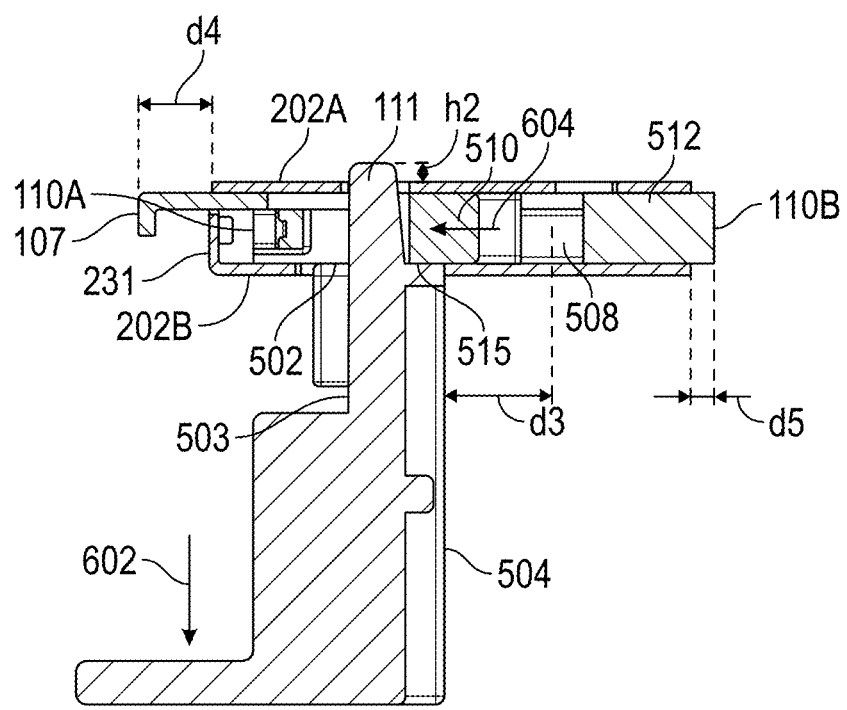
FIG. 6B illustrates a sectional view from the top of the lock device of FIG. 6A in a latch unlock status in accordance with an embodiment of the disclosure.

FIG. 6B illustrates a sectional view from the top of the lock device of FIG. 6A in a latch unlock status in accordance with an embodiment of the disclosure. Again, this sectional view is from a top side of FIG. 6A with focus on auto lock feature, the section is similar to FIG. 5B. As shown, the latch element 111 is down from the top rail 202A of the base, as pointed by an arrow 602. The latch element 111 has a height $h_2$ above the top rail 202A, where $h_2$ is much smaller than $h_1$, as illustrated in FIG. 5B. The latch element 111 is in an unlock position. The flange 115B is stopped against the bottom rail 202B, as illustrated by an interface 515.

Also, a horizontal distance $d_3$ between the center of the first portion 508 of the second slider and the outer surface 504 of the latch assembly is larger than the distance $d_1$ shown in FIG. 5B. Also, an arrow 604 shows that the first slider 102 moves to the right, such that the distance $d_4$ between the lip 107 and the end surface 231 is larger than the distance $d_2$ shown in FIG. 5B. The rear end 110B of the second slider 104 remains the same as shown in FIG. 5B. The distance between the rear end 110B of the second slider and the end of the base 202 is $d_5$, which remains the same as illustrated in FIG. 5.

Figure 7A:
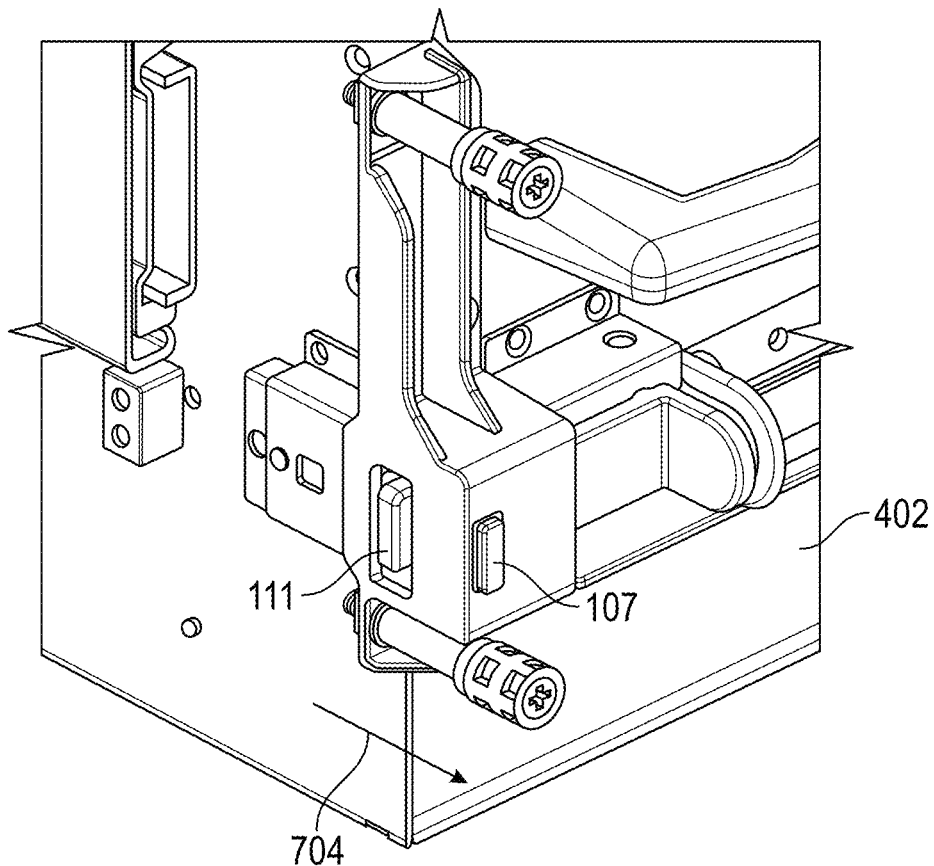
FIG. 7A illustrates a perspective view of the lock device of FIG. 2C in a latch impending lock status when the chassis slides out of a housing in accordance with an embodiment of the disclosure.

FIG. 7A illustrates a perspective view of the lock device of FIG. 2C in a latch impending lock status when the chassis slides out of a housing in accordance with an embodiment of the disclosure. As shown, an arrow 704 illustrates that the chassis 402 slides out of a housing. The latch element 111 is in a latch impending lock position.

Figure 7B:
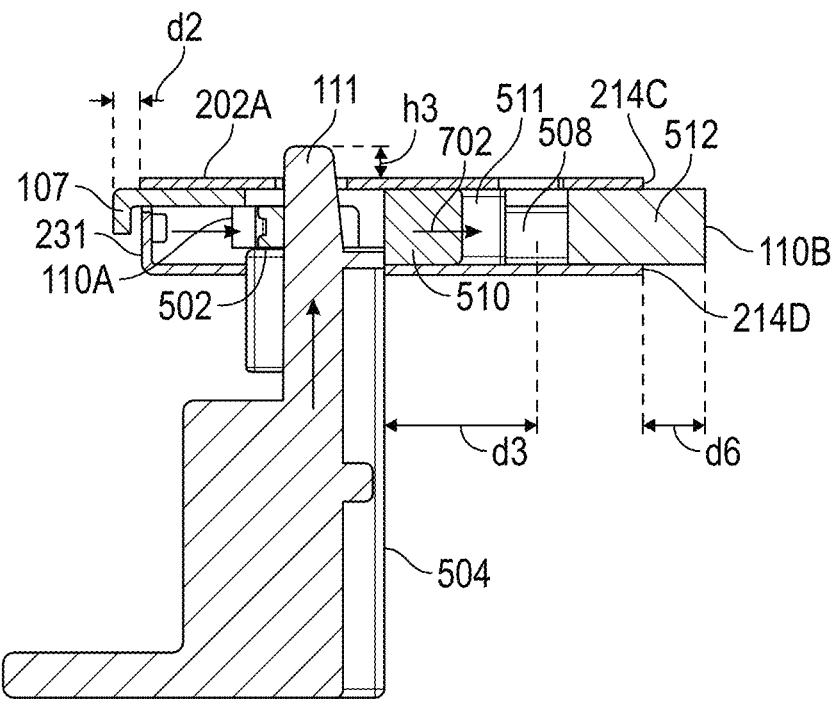
FIG. 7B illustrates a sectional view from the top of the lock device of FIG. 7A in a latch impending lock status in accordance with an embodiment of the disclosure.

FIG. 7B illustrates a sectional view from the top of the lock device of FIG. 7A in a latch impending lock status in accordance with an embodiment of the disclosure. Again, this sectional view is from a top side of FIG. 6A with focus on auto lock feature, the section is similar to FIG. 5B. As shown, the height of the latch element 111 from the top rail 202A is $h_3$, which is larger than the height $h_2$ shown in FIG. 6B, but smaller than the height $h_1$ shown in FIG. 5B. This intermediate height $h_2$ indicates that the latch element 111 is in a latch impending lock position. The flange 115A is stopped near the front end 110A of the second slider, as illustrated by the interface 502.

Also, an arrow 702 shows that the second slider 104 moves to the right and also the rear end 110B of the second slider extends further to the right from the ends 214C and 214D of base 202, compared to FIG. 6B. Now, the distance of the outer surface of the rear end 110B from the ends 214C-B of the base is $d_6$, which is larger than $d_5$ shown in FIG. 6B. When the chassis 402 is slided out of the housing, the rear end 110B of the second slider 104 moves away from a tab in the housing (not shown) such that there is no more force pushed against the end 110B of the second slider 104. Then, the springs 204A and 204B generate a larger force than the spring 204C, which pushes both sliders 102 and 104 toward the right. The lip 107 has a distance $d_2$, which remains unchanged from FIGS. 5B and 6B. The first portion 508 has a distance $d_3$ from the outer surface 504 of the latch assembly, which remains the same as illustrated in FIG. 6B, but is different from that illustrated in FIG. 5B.

Figure 8A:
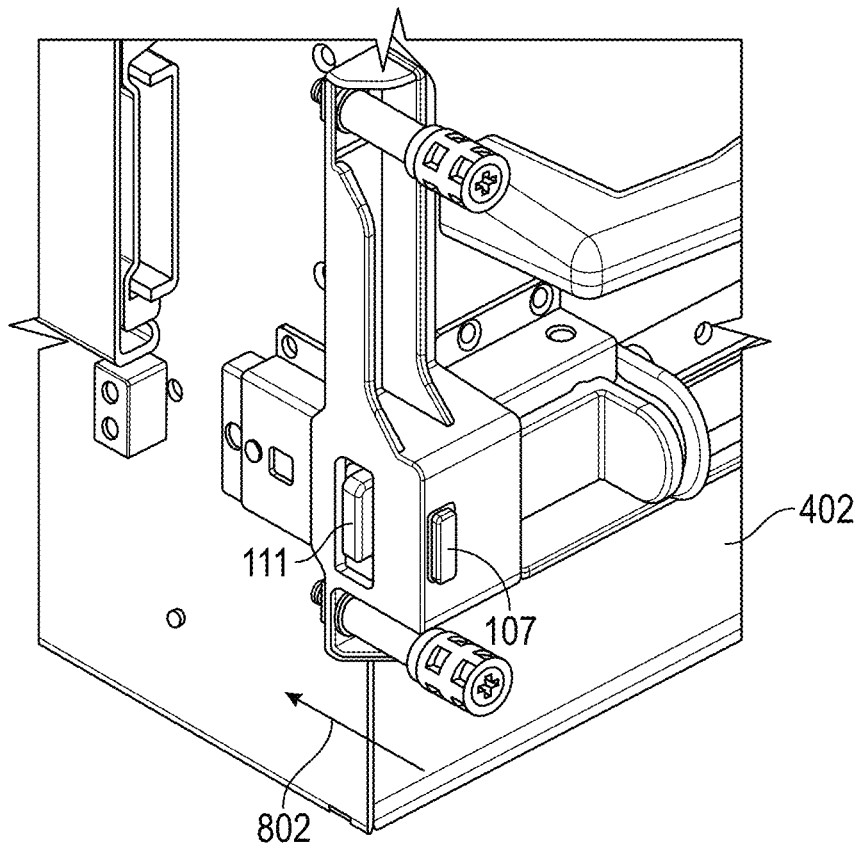
FIG. 8A illustrates a perspective view of the lock device of FIG. 2C in a latch impending lock status when the chassis is moving to a slide-in position, in accordance with an embodiment of the disclosure.

FIG. 8A illustrates a perspective view of the lock device of FIG. 2C in a latch impending lock status when the chassis is moving to a slide-in position in accordance with an embodiment of the disclosure. As shown, an arrow 802 illustrates that the chassis slides into a housing. The latch element 111 is in a latch impending lock status.

Figure 8B:
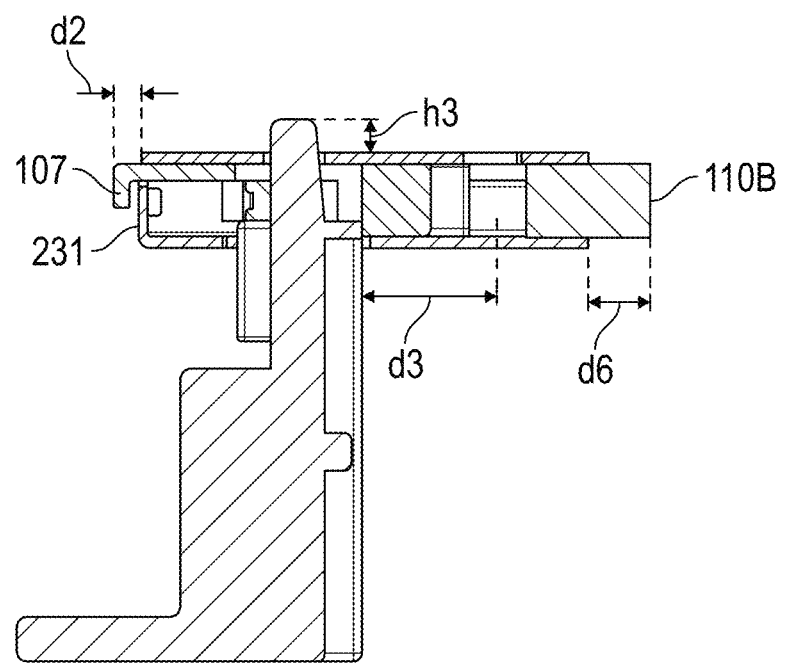
FIG. 8B illustrates a sectional view from the top of the lock device of FIG. 8A in a latch impending lock status when the chassis slides into a housing, in accordance with an embodiment of the disclosure.

FIG. 8B illustrates a sectional view from the top of the lock device of FIG. 8A in a latch impending lock status in accordance with an embodiment of the disclosure. Again, this sectional view is from a top side of FIG. 6A with focus on auto lock feature, the section is similar to FIG. 5B. When the chassis is slided into the housing, the latch assembly is in a latch impending lock status until the chassis hits against the housing. The latch element 111 has a height $h_3$ from the top rail 202A, which indicates that the latch element 111 is in the latch impending lock status. The lip 107 has a distance $d_2$, which remains unchanged from FIGS. 5B and 7B and is different from FIG. 6B. The component 508 has a distance $d_3$ from the outer surface 504 of the latch assembly, which remains the same as illustrated in FIGS. 6B and 7B, but is different from that illustrated in FIG. 5B. The distance of the outer surface of the rear end 110B from the ends 214C-B of the base is $d_6$, which is the same as shown in FIG. 7B, but is different from that illustrated in FIGS. 5B and 6B.

Figure 9A:
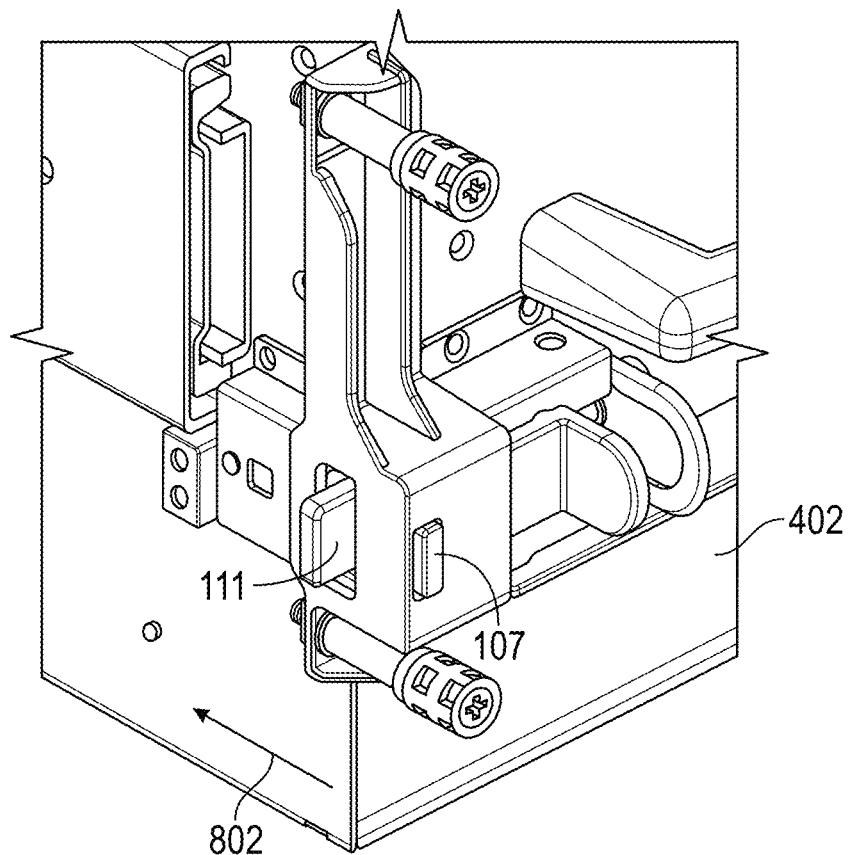
FIG. 9A illustrates a perspective view of the lock device of FIG. 2C in a latch lock status when the chassis is moving to a slide-in position, in accordance with an embodiment of the disclosure.

FIG. 9A illustrates a perspective view of the lock device of FIG. 2C in a latch lock status when the chassis is moving to a slide-in position, in accordance with an embodiment of the disclosure. As shown, after the chassis slides into the housing, the latch element 111 is in a lock status.

Figure 9B:
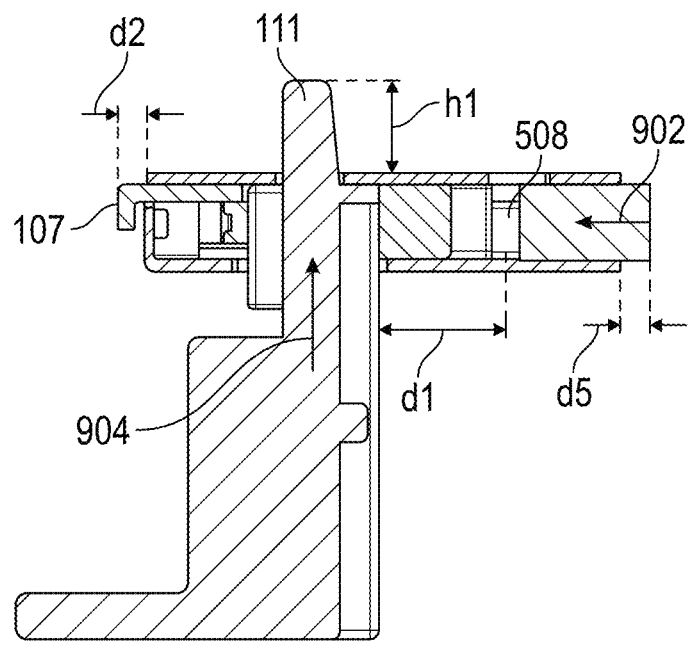
FIG. 9B illustrates a sectional view from the top of the lock device of FIG. 9A in a latch lock status when the chassis slides into a housing, in accordance with an embodiment of the disclosure.

FIG. 9B illustrates a sectional view from the top of the lock device of FIG. 9A in a latch lock status when the chassis slides in, in accordance with an embodiment of the disclosure. As shown, an arrow 902 illustrates the movement of the second slider 102 toward the latch element 111. When the chassis is slided into the housing, a tab (not shown) fixed on a rack or rail bracket of the housing can push both the first and second sliders 102 and 104 together to the left, as illustrated by the arrow 902. Then, the latch assembly 106 would lose support from the slider 102 and would automatically jump into the lock position. Note that the distance of the outer surface of the read end 110B of the second slider changes back to $d_5$ from $d_6$ shown in FIG. 8B. The latch element 111 is in a lock status, as the height of the latch element 111 changes to $h_1$, the same as shown in FIG. 5B. The lip 107 has a distance $d_2$, which remains unchanged from FIG. 8B and is the same as that in FIG. 5B. The component 508 has a distance $d_1$ from the outer surface 504 of the latch assembly, which is changed from FIG. 8B, but is the same as illustrated in FIG. 5B. The distance of the outer surface of the rear end 110B from the ends 214C-B of the base is $d_5$, which is smaller than $d_6$ shown in FIG. 8B.

Figure 10A:
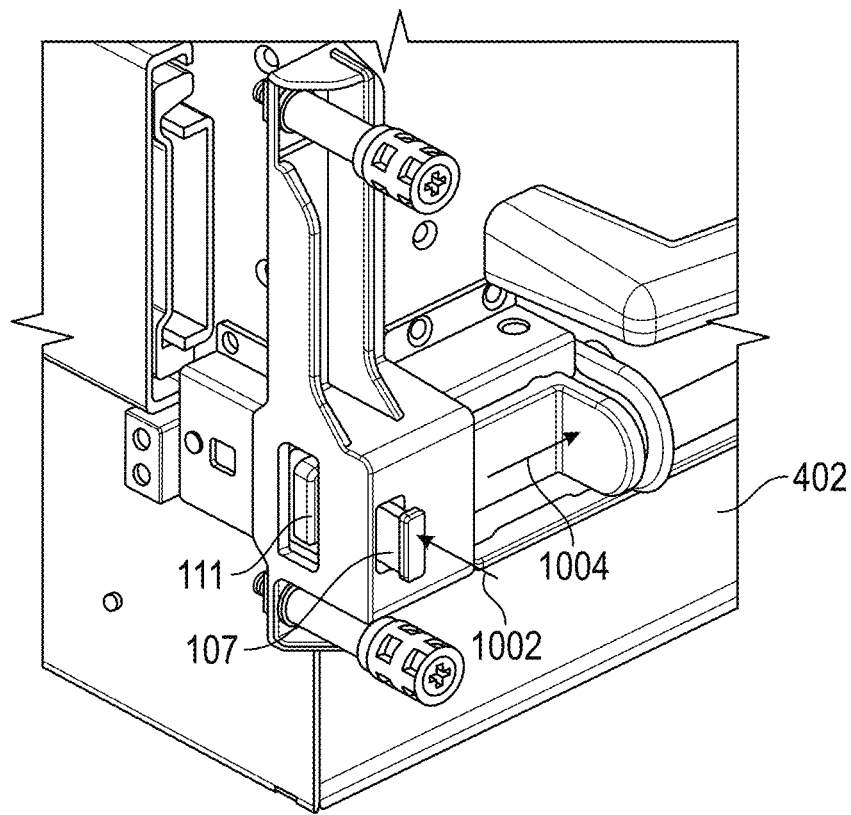
FIG. 10A illustrates a perspective view of the lock device of FIG. 2C jumping to a latch unlock status when a user falsely triggers a handle in accordance with an embodiment of the disclosure.
Figure 10B:
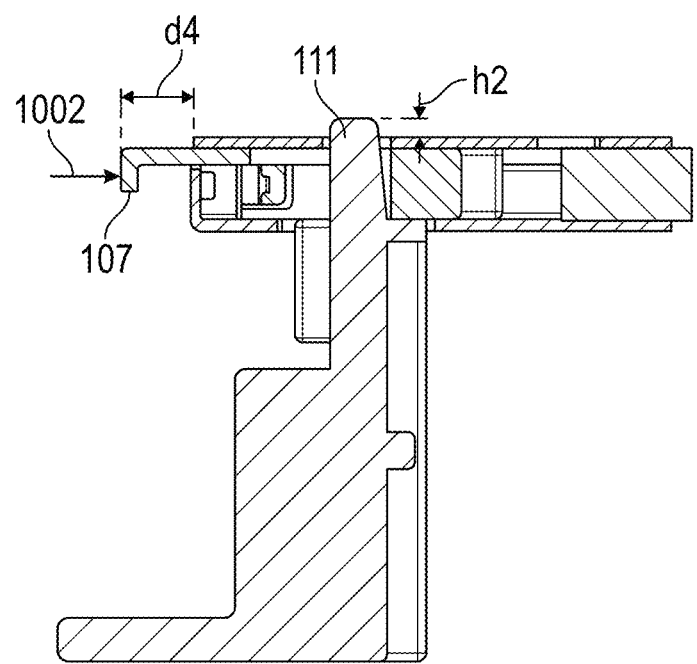
FIG. 10B illustrates a sectional view from the top of the lock device of FIG. 10A jumping back to a latch lock status when a user falsely triggers a handle in accordance with an embodiment of the disclosure.

When a user falsely triggers the first handle 230, the latch element 111 may jump to an unlock position, as illustrated in FIGS. 10A-B. FIG. 10A illustrates a perspective view of the lock device of FIG. 2C jumping to a latch unlock status when a user falsely triggers a handle of the latch assembly in accordance with an embodiment of the disclosure. FIG. 10B illustrates a sectional view from the top of the lock device of FIG. 10A jumping back to a latch lock status in accordance with an embodiment of the disclosure. As shown, the lip 107 is compressed as pointed by an arrow 1002, and the latch element 111 is in an unlock status, as the latch element 111 extends out at a height $h_2$.

Figure 11A:
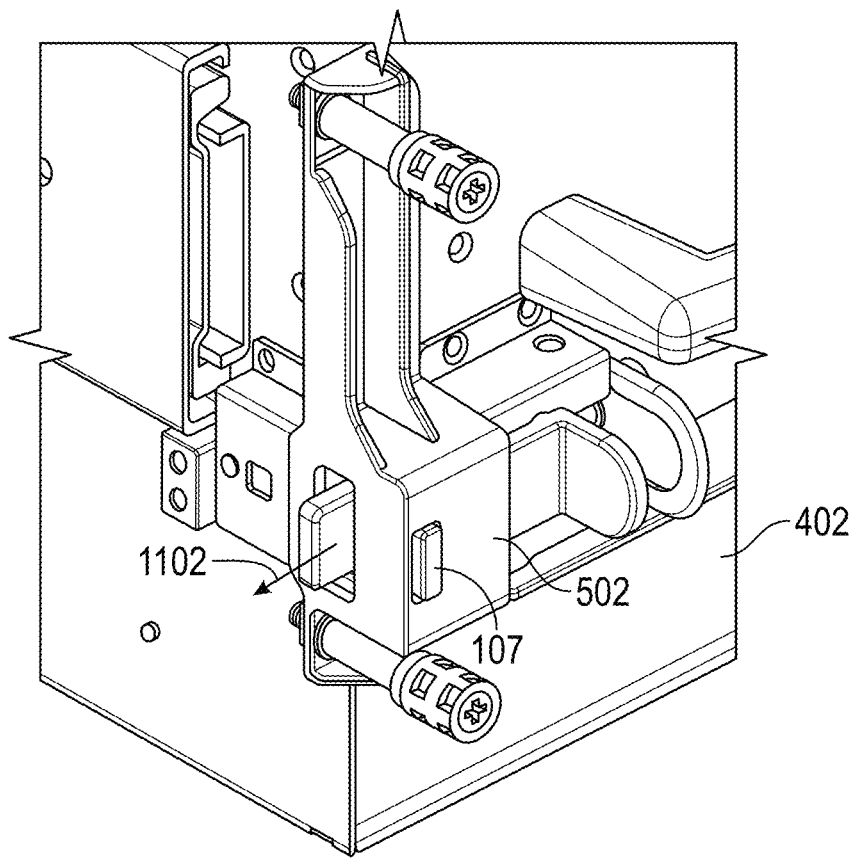
FIG. 11A illustrates a perspective view of the lock device of FIG. 10A jumping back to a latch lock status by compressing the first slider in accordance with an embodiment of the disclosure.
Figure 11B:
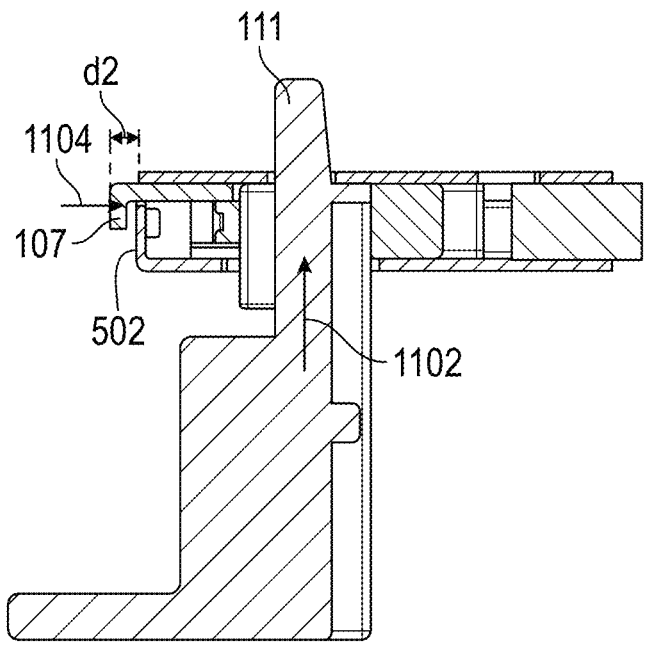
FIG. 11B illustrates a sectional view from the top of the lock device of FIG. 11A jumping back to a latch lock status by compressing the first slider in accordance with an embodiment of the disclosure.

The latch element 111 may jump back to a lock position, as illustrated in FIGS. 11A-B. FIG. 11A illustrates a perspective view of the lock device of FIG. 10A jumping back to a latch lock status by compressing the lip 107 of the first slider 102 in accordance with an embodiment of the disclosure. As shown, arrow 1102 illustrates that the latch element 111 moves to extend outside to be in a lock status.

FIG. 11B illustrates a sectional view from the top of the lock device of FIG. 11A jumping back to a latch lock status by compressing the first slider in accordance with an embodiment of the disclosure. As shown, arrow 1102 illustrates that the latch element 111 moves upward to be in a lock status. An arrow 1104 illustrates that the lip 107 of the first slider is compressed toward the end surface 231.

The disclosure provides an auto lock latch, which is different from any other solutions on market. The disclosed lock device or system allows a user to use a single gesture to unlock the latch element without holding the latch element in position when moving the chassis out of a housing or moving the chassis into the housing. The latch element can maintain in an unlock position until the chassis returns to a slide-in position, then the latch element can be triggered back to lock position automatically.

Table 1 lists a summary of latch element status and slider assembly positions. As shown, when the slider assembly is in a lock position, the latch element is in a lock status. when the slider assembly is in an unlock position, the latch element is in an unlock status. when the slider assembly is in a latch impending lock position, the latch element is in a latch impending lock status.

TABLE 2

| Latch element status | Slider assembly position |
|---|---|
| Latch lock status | Lock position |
| Latch unlock status | Unlock position |
| Latch impending lock status | Latch impending lock position |

Table 2 lists a summary of latch element status versus latch element height. The heights are illustrated in FIGS. 5B, 6B, 7B, 8B, 9B, 10B, and 11B.

TABLE 2

| Latch element status | Latch element Height |
|---|---|
| Latch lock status | $h_1$ |
| Latch unlock status | $h_2$ |
| Latch impending lock status | $h_3$ |

Table 3 lists a summary of slider assembly positions versus the position of the lip 107 of the first slider 102 to the front end 214A of the top rail of the base 202 or from the end surface 231. Table 3 also lists the position of the outer surface of the rear end 110B of the second slider 104 from the opposite rear end 214C of the top rail of base 202 for each slider assembly position. The positions as represented by various distances $d_1$, $d_2$, $d_3$, $d_4$, $d_5$, and $d_6$ are illustrated in FIGS. 5B, 6B, and 7B.

TABLE 3

| Slider assembly position | Latch element Height | Position of the lip of first slider | Position of outer surface of second slider |
|---|---|---|---|
| Lock position | $h_1$ | $d_2$ | $d_5$ |
| Unlock position | $h_2$ | $d_4$ | $d_5$ |
| Latch impending lock position | $h_3$ | $d_2$ | $d_6$ |

Simulations are performed to analyze stress distributions for various scenarios including the worst ones. The base for the slider assembly may be formed of a sheet metal, among others. The latch element may be formed of a zinc alloy in a die casting process, among others. The sliders may be formed of a plastic. The material properties for the simulations are listed in Table 4.

TABLE 4

Material Properties

| Material | Density (g/cm$^3$) | Yield Strength (MPa) | Elastic Modulus (MPa) | Poisson's Ratio |
|---|---|---|---|---|
| Sheet metal (SGCC) | 7.85 | 278 | 210,000 | 0.3 |
| Zinc alloy (Zamak 5) | 6.70 | 228 | 85,500 | 0.27 |
| Plastic | 1.41 | 62 | 2,270 | 0.40 |

Figure 12:
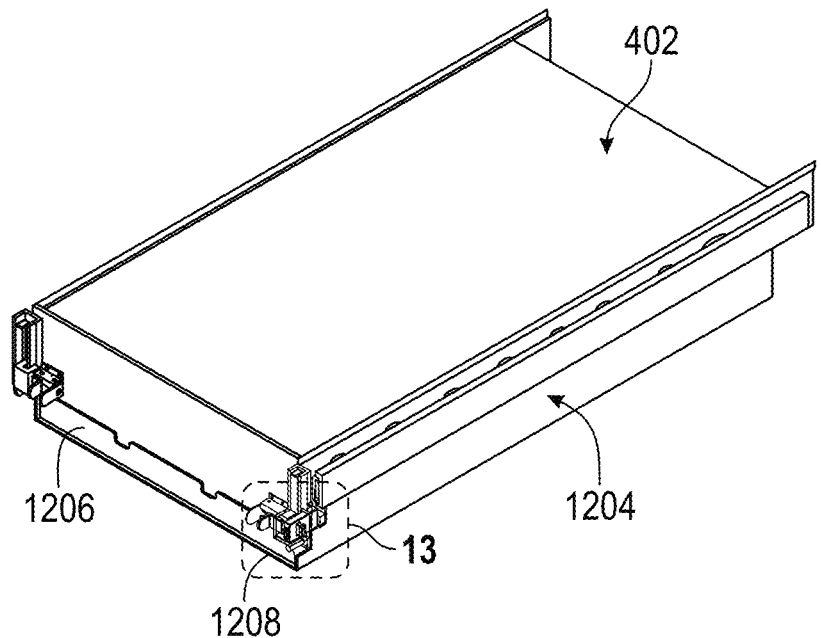
FIG. 12 illustrates a perspective view of a chassis with the lock device installed in accordance with an embodiment of the disclosure.

FIG. 12 illustrates a perspective view of a chassis with the lock device installed in accordance with an embodiment of the disclosure. As shown in FIG. 12, a chassis 402 is installed in a housing 1204 with a front surface 1206. The chassis 402 may be in a rectangular prism shape. The chassis 402 may have a server inside. At one of the front corner of the chassis 402, a lock device 1208, including the latch assembly assembled with the slider assembly, is installed.

Figure 13:
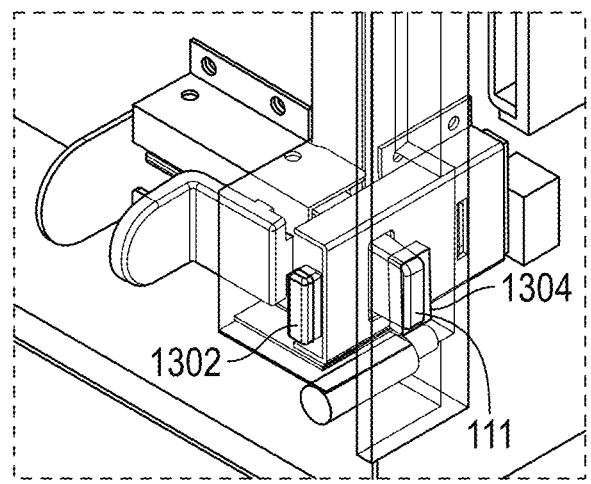
FIG. 13 illustrates an enlarged perspective view of the lock device of FIG. 12 mounted on the chassis in accordance with an embodiment of the disclosure.

FIG. 13 illustrates an enlarged perspective view of the lock device of FIG. 12 mounted on the chassis in accordance with an embodiment of the disclosure. As shown in FIG. 13, a handle 1302 is coupled to the lip of the first slider. The latch element 111 is locked into a slot or frame 1304 embedded in the housing 1204. When the latch element 111 is in the slot or frame 1304, the chassis is locked. When the latch element 111 moves out of the frame 1304, the chassis is unlocked.

Figure 14:
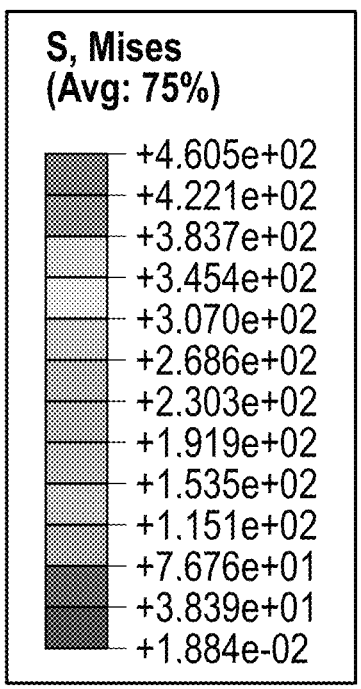
FIG. 14 illustrates a stress distribution for a lock device based upon simulations from modeling in accordance with an embodiment of the disclosure.
Figure 14:
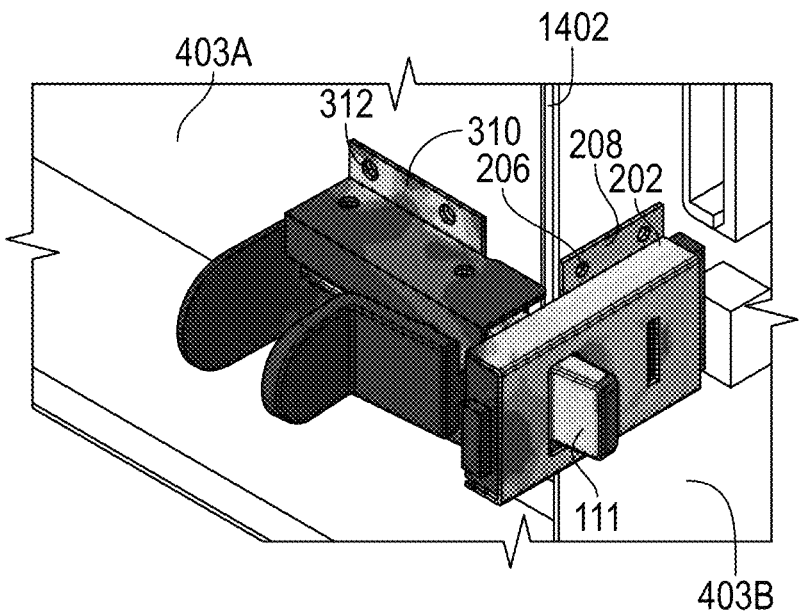

FIG. 14 illustrates a stress distribution for a lock device based upon simulations from modeling in accordance with an embodiment of the disclosure. As shown, the lock device 200 is mounted to the chassis 402. The mounting plate 224 is attached to the front surface 403A of the chassis 402, while the mounting plate 208 for the base 202 is attached to the side surface 403B. The latch element 111 extends into the chassis beyond the side surface 403B to lock into a housing (not shown).

Figure 15:
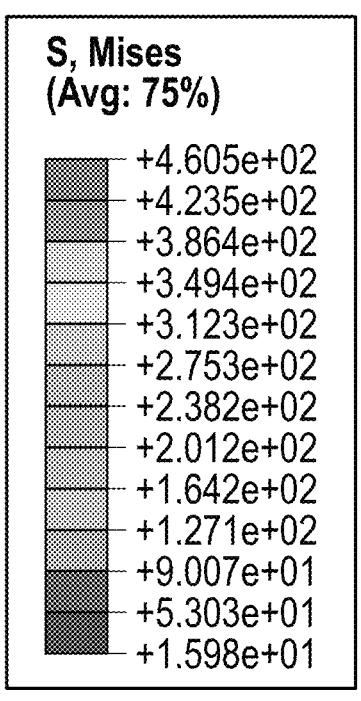
FIG. 15 illustrates a stress distribution for the base of FIG. 14 in accordance with an embodiment of the disclosure.
Figure 15:
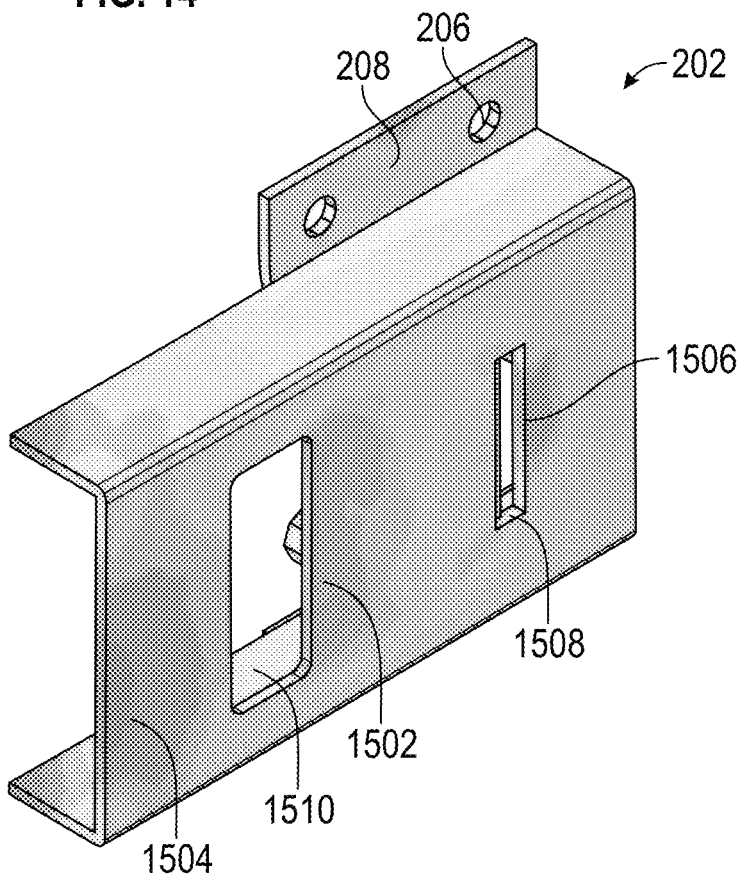

FIG. 15 illustrates a stress distribution for the base of FIG. 14 in accordance with an embodiment of the disclosure. As shown, the base 202 has a non-uniform stress distribution when mounted to the chassis as illustrated in FIG. 14. The highest stress is in a region 1502, which is near one side (where the base 202 is mounted to the chassis) of a first slot 1510, which is located near the corner 1402. The lowest stress is in region 1504, which is near an edge of the base 202 and is away from the corner 1402. The lowest stress is also in region 1506, which is near a second slot 1508, which is away from the corner 1402.

Figure 16:
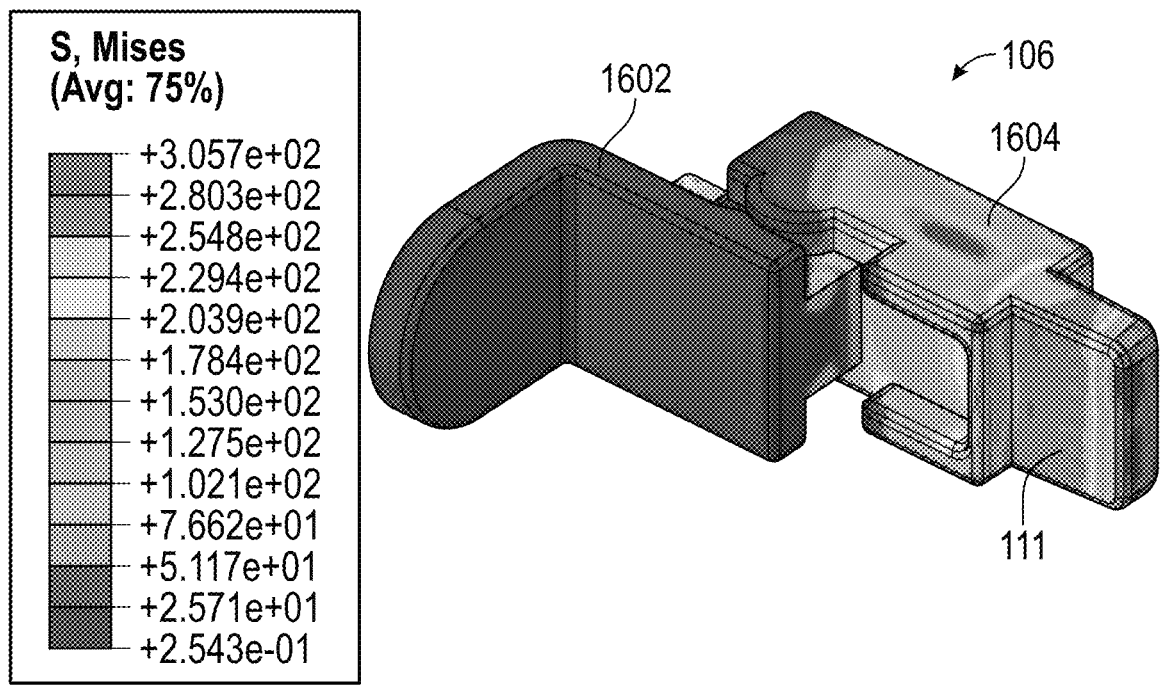
FIG. 16 illustrates a stress distribution for the latch assembly of FIG. 14 in accordance with an embodiment of the disclosure.

FIG. 16 illustrates a stress distribution for the latch assembly in accordance with an embodiment of the disclosure. As shown, the latch assembly 106 has a non-uniform stress distribution. The highest stress is near the latch element 111. The lowest stress is near a rear portion 1602. A middle portion 1604 has the stress in a range between the highest stress and the lowest stress.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall therebetween.

What is claimed is:

1. A lock device comprising:
   a slider assembly comprising a first slider, a second slider movably coupled to the first slider, and a first base having a planar portion with a top rail and a bottom rail and a second base that hold the slider assembly and allows the relative movement of the first slider relative to the second slider along the top and bottom rails in the first base, wherein the second slider can move relative to the first slider to different positions comprising a latch lock position, a latch unlock position, and a latch impending lock position; and
   a latch assembly attached to a chassis, the latch assembly comprising a latch element configured to move to a first, a second, and a third distances from the top rail of the first base corresponding to the latch lock position, the latch unlock position, and the latch impending lock position of the slider assembly, respectively,
   wherein the first slider comprises a first planar portion having a first recess, a middle portion having a first slot configured to engage with the latch element, a lip coupled to the middle portion, opposite to the first recess.

2. The device of claim 1, wherein the slider assembly comprises at least one spring engaged with the second slider, wherein the second slider comprises at least one recess at a first end, the at least one recess configured to hold a portion of the at least one spring, wherein the second base comprises a tab configured for the at least one spring to mount.

3. The device of claim 2, wherein the slider assembly comprises a second spring engaged with the first recess of the first planar portion of the first slider.

4. The device of claim 3, wherein the at least one spring generates a larger spring force than the second spring.

5. The device of claim 1, wherein the second slider comprises a second planar portion having a second slot that is configured to engage with the latch element, wherein the second slot overlaps with the first slot and is larger than the first slot.

6. The device of claim 5, wherein the first slider moves to the latch lock position relative to the second slider, such that the latch element is in a lock status.

7. The device of claim 5, wherein the first slider moves to the latch unlock position relative to the second slider, such that the latch element is in an unlock status and is stopped by the first planar portion of the first slider, the first planar portion is on one side of the first slot.

8. The device of claim 5, wherein the first slider moves to the latch impending lock position relative to the second slider, such that the latch element is in an impending lock status, and is stopped by the second planar portion of the second slider, the second planar portion is on an opposite side of the first slot and is a protruded portion from an end of the second slider facing a lip of the first slider.

9. The device of claim 1, wherein the latch assembly comprises a handle configured to move the latch element to a lock status and an unlock status.

10. The device of claim 1, wherein the first base comprises a third slot configured to allow the latch element to move in and out.

11. The device of claim 1, wherein the first base comprises a first mounting plate having holes configured to attach to a side of the chassis.

12. The device of claim 11, further comprising a second mounting plate attached to the latch assembly, the second mounting plate having holes configured to attach to a front face of the chassis.

13. The device of claim 12, wherein the second mounting plate is substantially perpendicular to the first mounting plate.

14. The device of claim 1, wherein the chassis is configured to hold a server.

15. The device of claim 1, wherein the base comprises a sheet metal.

16. The device of claim 1, wherein each of the first and second sliders comprises a plastic.

17. The device of claim 1, wherein the latch element comprises zinc alloy.

18. The device of claim 1, wherein the latch element is configured to remain in a latch impending lock status, when the chassis is slided out of the housing, wherein the latch element is configured to jump to a latch lock status from the latch impending lock status, when the chassis is slided into the housing.

19. A server chassis with a locking mechanism, the server chassis comprising:
 a chassis configured to hold a server; and
 a lock device installed on the chassis, the lock device comprising:
 a slider assembly comprising a first slider, a second slider movably coupled to the first slider, and a base having a planar portion with a top rail and a bottom rail that hold the slider assembly and allows the relative movement of the first slider relative to the second slider along the top and bottom rails in the base, wherein the second slider can move relative to the first slider to different positions comprising a latch lock position, a latch unlock position, and a latch impending lock position; and
 a latch assembly attached to the chassis, the latch assembly comprising a latch element configured to move to a first, a second, and a third distances from the top rail of the base corresponding to the latch lock position, the latch unlock position, and the latch impending lock position of the slider assembly, respectively,
 wherein the first slider comprises a first planar portion having a first recess, a middle portion having a first slot configured to engage with the latch element, a lip coupled to the middle portion, opposite to the first recess.

20. A lock device comprising:
 a slider assembly comprising a first slider, a second slider movably coupled to the first slider, and a first base having a planar portion with a top rail and a bottom rail and a second base that hold the slider assembly and allows the relative movement of the first slider relative to the second slider along the top and bottom rails in the first base, wherein the second slider can move relative to the first slider to different positions comprising a latch lock position, a latch unlock position, and a latch impending lock position; and
 a latch assembly attached to a chassis, the latch assembly comprising a latch element configured to move to a first, a second, and a third distances from the top rail of the first base corresponding to the latch lock position, the latch unlock position, and the latch impending lock position of the slider assembly, respectively,
 wherein the first slider comprises a first planar portion having a first recess, a middle portion having a first slot configured to engage with the latch element, a lip coupled to the middle portion, opposite to the first recess,
 wherein the second slider comprises a second planar portion having a second slot that is configured to engage with the latch element, wherein the second slot overlaps with the first slot and is larger than the first slot.

* * * * *